United States Patent [19]
Ovshinsky et al.

[11] Patent Number: 5,534,712
[45] Date of Patent: Jul. 9, 1996

[54] ELECTRICALLY ERASABLE MEMORY ELEMENTS CHARACTERIZED BY REDUCED CURRENT AND IMPROVED THERMAL STABILITY

[75] Inventors: Stanford R. Ovshinsky, Bloomfield Hills; David A. Strand, Bloomfield Township; Patrick Klersy, Lake Orion, all of Mich.

[73] Assignee: Energy Conversion Devices, Inc., Troy, Mich.

[21] Appl. No.: 517,313

[22] Filed: Aug. 21, 1995

Related U.S. Application Data

[63] Continuation-in-part of Ser. No. 423,484, Mar. 19, 1995, which is a continuation-in-part of Ser. No. 789,234, Nov. 7, 1991, Pat. No. 5,414,271, which is a continuation-in-part of Ser. No. 768,139, Sep. 30, 1991, Pat. No. 5,335,219, and Ser. No. 747,053, Aug. 19, 1991, Pat. No. 5,296,716, each is a continuation-in-part of Ser. No.642,984, Jan. 18, 1991, Pat. No. 5,166,758.

[51] Int. Cl.$^6$ ............................................. H01L 45/00
[52] U.S. Cl. ............................... 217/3; 257/2; 257/5
[58] Field of Search ............................................ 257/2–5

[56] References Cited

U.S. PATENT DOCUMENTS

5,406,509  4/1995  Ovshinsky ........................ 257/3
5,414,271  5/1995  Ovshinsky ........................ 257/3

*Primary Examiner*—William D. Larkins
*Attorney, Agent, or Firm*—David W. Schumaker; Marvin S. Siskind; Marc J. Luddy

[57] ABSTRACT

Disclosed herein is a solid state, directly overwritable, non-volatile, high density, low cost, low energy, high speed, readily manufacturable, single cell memory element having reduced switching current requirements and an increased thermal stability of data retention. The memory element includes a volume of memory material which is a transition metal modified chalcogen. The transition metal may be selected from the group consisting of Nb, Pd, Pt and mixtures or alloys thereof. The memory material may further include at least one transition metal selected from the group consisting of Fe, Cr, Ni and mixtures or alloys thereof. The memory element exhibits orders of magnitude higher switching speeds at remarkably reduced switching energy levels. The novel memory element of the instant invention is in turn characterized, inter alia, by at least two stable and non-volatile detectable configurations of local atomic and/or electronic order, which configurations can be selectively and repeatably accessed by electrical input signals of designated energy levels. The memory elements are further characterized by enhanced thermal stability of data retention, which stability is achieved by elementally modifying Te—Ge—Sb semiconductor material from which previous memory elements were fabricated.

20 Claims, 6 Drawing Sheets

ELECTRICALLY ERASABLE MEMORY ELEMENTS CHARACTERIZED BY REDUCED CURRENT AND IMPROVED THERMAL STABILITY

RELATED APPLICATION INFORMATION

This application is a continuation-in-part of U.S. application Ser. No. 08/423,484 filed Mar. 19, 1995, which is a continuation-in-part of U.S. application Ser. No. 07/789,234 filed Nov. 7, 1991, now U.S. Pat. No. 5,414,271 which is a continuation-in-part of U.S. application Ser. No. 07/768,139, filed Sep. 30, 1991, now U.S. Pat. No. 5,335,219, and a continuation-in-part of U.S. application Ser. No. 07/747,053 filed Aug. 19, 1991, now U.S. Pat. No. 5,296,716, each of which in turn is a continuation-in-part of U.S. application Ser. No. 07/642,984 filed Jan. 18, 1991, now U.S. Pat. No. 5,166,758.

FIELD OF THE INVENTION

The present invention relates to improved solid state, electrically operated, directly overwritable, extremely low energy, very fast switching, non-volatile, single-cell memory elements, and to high density parallel circuits and high density electrical memory arrays (hereinafter also referred to an "Ovonic EEPROM") fabricated from these memory elements. These improved memory elements were fabricated with unique materials so as to be characterized by reduced switching current requirements as well as greater thermal stability of the data stored within the elements than was possible in previous elements.

BACKGROUND AND PRIOR ART

The Ovonic EEPROM is a novel, proprietary, high performance, non-volatile, thin film electronic memory device. In this device, information can be stored in either analog or binary form (one bit per cell) or in multi-state form (multiple bits per memory cell). The advantages of the Ovonic EEPROM include non-volatile data storage, the potential for high bit density and consequently low cost as a result of its small footprint and simple two-terminal device configuration, a long reprogramming cycle life, low programming energies and high speed. There are small differences in the structure and the materials employed with these two types of memory devices, which differences enhance either the binary or multi-state performance characteristics thereof. For purposes of the instant invention, the terms "memory elements" and "control elements" will be employed synonymously.

Before detailing the operation and structure of this novel and fundamentally unique Ovonic EEPROM device of the instant invention, some very important and pertinent thoughts concerning general semiconductor structures and operation will be discussed. The operation of most semiconductor devices is governed by the control of mobile charge carrier concentrations different from that generated at thermal equilibrium. Prior to the invention of the Ovonic EEPROM, only four general methods were known by which to control and modulate the concentration of excess or free (these two terms are used interchangeably throughout this discussion) charge carriers in solid state semiconductor devices. These four known methods were previously described in said parent application, the disclosure of which is herein incorporated by reference, and need not be further discussed herein. However, a general discussion of those fundamental mechanisms of operation of semiconductor devices which are necessary in order to appreciate the advantages of the instant invention follows hereinafter.

In a perfect semiconductor lattice with no impurities or lattice defects—an intrinsic semiconductor—no charge carriers are present at zero Kelvin since the valence band is filled with electrons and the conduction band is empty. At higher temperatures, however, electron-hole pairs generated as valence band electrons are excited thermally across the band gap to the conduction band. These thermally generated electron-hole pairs are the only charge carriers present in an intrinsic semiconductor material. Of course, since the electrons and holes are created in pairs, the conduction band electron concentration (electrons per cubic centimeter) is equal to the concentration of holes in the valence band (holes per cubic centimeter). It is well known, but worth emphasizing, that if a steady state carrier concentration is to be maintained, there must be recombination of the charge carriers at the same rate that they are generated. Recombination occurs when an electron in the conduction band makes a transition to an empty state (hole) in the valence band, either directly or indirectly through the agency of a mid-gap recombination center, thus annihilating the pair.

In addition to thermally generated charge carriers, it is possible to create carriers in semiconductor materials by purposely introducing certain impurities into the crystal lattice. This process is called doping and represents a common method of varying the conductivity of semiconductors. By doping, a semiconductor material can be altered so that it has a predominance of either electrons or holes, i.e., it is either n-type or p-type. When a crystal lattice is doped such that the equilibrium carrier concentrations are different from the intrinsic carrier concentrations, the semiconductor material is said to be "extrinsic". When impurities or lattice defects are introduced into an otherwise perfect lattice crystal, additional levels are created in the energy band structure, usually within the band gap. For instance, the introduction of phosphorous in silicon or germanium, generates an energy level very near the conduction band. This new energy level is filled with electrons at zero Kelvin, and very little thermal energy is required to excite these electrons to the conduction band. Thus, at about 50–100 Kelvin, virtually all of the electrons in the impurity level are donated to the conduction band. Semiconductor material doped with donor impurities can have a considerable concentration of electrons in the conduction band, even when the temperature is too low for the intrinsic charge carrier concentration to be appreciable. Now that the reader can appreciate the significance of the presence of excess charge carriers for electrical conductivity, it must be noted that these carriers can also be created by optical excitation or they can be injected across a forward biased p-n junction or a Schottky barrier. Regardless of the manner in which the excess carriers are generated, they can dominate the electrical conduction processes in a semiconductor material.

EARLY ELECTRICAL PHASE CHANGE MEMORY

The general concept of utilizing electrically writable and erasable phase change materials (i.e., materials which can be electrically switched between generally amorphous and generally crystalline states) for electronic memory applications is well known in the art and as is disclosed, for example, in U.S. Pat. No. 3,271,591 to Ovshinsky, issued Sep. 6, 1966 and in U.S. Pat. No. 3,530,441 to Ovshinsky, issued Sep. 22, 1970, both assigned to the same assignee as the present invention, and both disclosures of which are incorporated herein by reference (hereinafter the "Ovshinsky patents"). As disclosed in the Ovshinsky patents, such phase change materials can be electrically switched between structural states of generally amorphous and generally crystalline local order or between different detectable states of local order across the entire spectrum between the completely amorphous and the completely crystalline states. That is, the Ovshinsky patents describe that the electrical switching of such materials is not required to take place between completely amorphous and completely crystalline states but rather can be in incremental steps reflecting changes of local order to provide a "gray scale" represented by a multiplicity of conditions of local order spanning the spectrum between the completely amorphous and the completely crystalline states. The early materials described by the Ovshinsky patents could also be switched between only two structural states of generally amorphous and generally crystalline local order to accommodate the storage and retrieval of single bits of binary encoded information.

The electrically erasable phase change memories described in the Ovshinsky patents were utilized in a number of commercially significant applications. However, due to the lack of funding necessary to commercialize the Ovshinsky memories, subsequent developments in other fields of solid state electronic memories eventually displaced these early electrically erasable phase change technology in the marketplace and prevented these phase change electrical memories from being used in electrical devices such as, for instance, personal computers.

In the typical personal computer there often are four tiers of memory. Archival information is stored in inexpensive, slow, high storage capacity, non-volatile devices such as magnetic tape and floppy disks. This information is transferred, as needed, to faster and more expensive, but still non-volatile, hard disk memories. Information from the hard disks is transferred, in turn, to the still more expensive, faster, volatile system memory which uses semiconductor dynamic RAM (DRAM) devices. Very fast computers even transfer forth and back small portions of the information stored in DRAM to even faster and even more expensive volatile static RAM (SRAM) devices so that the microprocessor will not be slowed down by the time required to fetch data from the relatively slower DRAM. Transfer of information among the tiers of the memory hierarchy occupies some of the computer's power and this need for "overhead" reduces performance and results in additional complexity in the computer's architecture. The current use of the hierarchal structure, however, is dictated by the price and performance of available memory devices and the need to optimize computer performance while minimizing cost.

The electrically erasable phase change memories described in the Ovshinsky patents, as well as subsequent electrical solid state memory, had a number of limitations that prevented their widespread use as a direct and universal replacement for present computer memory applications, such as tape, floppy disks, magnetic or optical hard disk drives, solid state disk flash, DRAM, SRAM, and socket flash memory. Specifically, the following represent the most significant of these limitations: (i) a relatively slow (by present standards) electrical switching speed, particularly when switched in the direction of greater local order (in the direction of increasing crystallization); (ii) a relatively high input energy requirement necessary to initiate a detectable change in local order; and (iii) a relatively high cost per megabyte of stored information (particularly in comparison to present hard disk drive media).

The most significant of these limitations is the relatively high energy input required to obtain detectable changes in the chemical and/or electronic bonding configurations of the chalcogenide material in order to initiate a detectable change in local order. Also significant were the switching times of the electrical memory materials described in the Ovshinsky patents. These materials typically required times in the range of a few milliseconds for the set time (the time required to switch the material from the amorphous state to the crystalline state); and approximately a microsecond for the reset time (the time required to switch the material from the crystalline state back to the amorphous state). The electrical energy required to switch these materials typically measured in the range of about a microjoule.

It should be noted that this amount of energy must be delivered to each of the memory elements in the solid state matrix of rows and columns of memory cells. Such high energy levels translate into high current carrying requirements for the address lines and for the cell isolation/address device associated with each discrete memory element. Taking into consideration these energy requirements, the choices of memory cell isolation elements for one skilled in the art would be limited to very large single crystal diode or transistor isolation devices, which would make the use of micron scale lithography and hence a high packing density of memory elements impossible. Thus, the low bit densities of matrix arrays made from this material would result in a high cost per megabyte of stored information.

By effectively narrowing the distinction in price and performance between archival, non-volatile mass memory and fast, volatile system memory, the memory elements of the present invention have the capability of allowing for the creation of a novel, non-hierarchal "universal memory system". Essentially all of the memory in the system can be low cost, archival and fast. As compared to original Ovshinsky-type phase change electrical memories, the memory materials described herein provide over six orders of magnitude faster programming time (less than 30 nanoseconds) and use extraordinarily low programming energy (less than 50 epicojoules) with demonstrated long term stability and cyclability (in excess of 20 million cycles). Also, experimental results indicate that additional reductions in element size can increase switching speeds and cycle life.

In general, development and optimization of the class of chalcogenide memory materials has not proceeded at the same rate as other types of solid state electrical memories that now have substantially faster switching times and substantially lower set and reset energies. These other forms of memories typically employ several solid state microelectronic circuit elements for each memory bit, as many as three or four transistors per bit, for example, in some memory applications. The primary "non-volatile" memory elements in such solid state memories, such as EEPROM, are typically floating gate field effect transistor devices which have limited re-programmability and which hold a charge on the gate of a field effect transistor to store each memory bit. Since this charge can leak off with the passage of time, the storage of information is not truly non-volatile as it is in the phase change media of the prior art where information is stored through changes in the actual atomic configuration or electronic structure of the chalcogenide material from which the elements are fabricated. These other forms of memories now enjoy some limited acceptance in the marketplace.

In contrast to DRAM and SRAM volatile memory devices and unlike other "flash" devices, such as floating gate structures, no field effect transistor devices are required in the electrical memory devices of the present invention. In fact the electrically erasable, directly overwritable memory elements of the present invention represent the simplest possible electrical memory device to fabricate, comprising only two electrical contacts to a monolithic body of thin film chalcogenide material and a semiconductor diode for isolation. As a result, very little chip "real estate" is required to store a bit of information, thereby providing for a configuration of inherently high density memory chips. Further, and as described below, additional increases in information density can be accomplished in the memory elements of the present invention through the use of multibit storage in each discrete memory cell.

The solid state, electronic memories presently in use are relatively expensive to manufacture, the cost being typically about twice the cost per bit of storage capacity in relation to magnetic disk storage. On the other hand, these solid state, electronic memories provide certain advantages over magnetic disk memories in that they have no moving parts, require much less electrical energy to operate, are easy to transport and store, and are more versatile and adaptable for use with portable computers and other portable electronic devices. As a matter of fact, hard drive manufacturers are forecasting rapid growth in the use of ever smaller hard drives and eventually solid state memory storage in the portable computer field. In addition, these solid state memories are usually true random access systems as opposed to disk types which require physical movement of the disk head to the proper data track for accessing the desired memory location. However, in spite of such advantages, the higher cost of solid state electrically erasable memories have prevented them from enjoying a substantial share of the market now dominated by magnetic disk type memory systems. Although solid state electrically erasable memories could potentially be manufactured at reduced cost, the overall performance parameters of these materials are inadequate for them to fully replace magnetic disk systems.

Simply stated, no solid state memory system developed prior to the present invention, regardless of the materials from which it was fabricated, has been inexpensive; easily manufacturable; electrically writable and directly erasable (overwritable) using low input energies; capable of multibit storage in a single cell (had a gray scale), non-volatile; and capable of very high packing density. The memory system described hereinbelow, because it addresses all of the deficiencies of known memory systems, will find immediate widespread use as a universal replacement for virtually all types of computer memory currently in the marketplace. Further, because the memories of the present invention can be fabricated in an all thin-film format, three-dimensional arrays are possible for high speed, high density neural network, and artificial intelligence applications. The memory system of the present invention is therefore uniquely applicable to neural networks and artificial intelligence systems because its multi-layer, three-dimensional arrays provide massive amounts of information storage that is rapidly addressable, thus permitting learning from stored information.

It is clear from the discussion above that the quantitative changes in switching speed and energy requirements of the memories of the present invention compared to the phase change memories of the prior art demonstrates that these materials define an entirely new class of modulatable semiconductor material. In addition, the prior art has no analog to the direct overwrite, wide dynamic range and multibit storage capabilities of the memory elements of the present invention. Further, the operation of the semiconductor materials of the present invention occurs solely in the crystalline state and is therefore vastly different from the operation of all prior art electrical memory elements which have either relied upon crystalline-to-amorphous phase transitions, or depended upon the continual application of a current amplification field. Moreover, that difference in operation of devices fabricated from the semiconductor materials of the instant invention is a consequence of the manner in which not only the concentration of free charge can be modulated, inter alia, by an electric field, but the fact that the new concentration of free charge to which the device has been modulated remains constant after that electric field has been removed. This feature represents a fifth and fundamentally new mechanism for modulating the concentration of free charge in semiconductor devices and makes possible a range of new and simple switching and amplification techniques which have the capability of significantly impacting the semiconductor industry.

As should be abundantly clear to ordinarily skilled artisans, in order to address the flash EEPROM market and be seriously considered as a universal memory, it is essential that memory elements be truly non-volatile. This is even more significant if the memory element is claimed to possess multibit storage capabilities. If a set resistance value is lost or even found to significantly drift over time, the information stored therein is destroyed, users lose confidence in the archival capabilities of the memory and the technology loses all credibility. Any drift with time, regardless of how small, is a mortal enemy of memory devices and will continue to be a focal point in the development of this new class of memory elements. This will be true because other composition subsequently developed to improve switching speed, energy, etc., will also require optimization for stability.

In addition to set resistance stability, another highly important factor which would be required of a universal memory is low switching current. This is extremely significant when the EEPROMs are used for large scale archival storage. Used in this manner, the EEPROMs would replace the mechanical hard drives (such as magnetic or optical hard drives) of present computer systems. One of the main reasons for this replacement of conventional mechanical hard drives with EEPROM "hard drives" would be to reduce the comparatively large power consumption of the mechanical systems. In the case of lap-top computers, this is of particular interest because the mechanical hard disk drive is one of the largest power consumers therein. Therefore, it would be especially advantageous to reduce this power load, thereby substantially increasing the usage time of the computer per charge of the power cells. However, if the EEPROM replacement for mechanical hard drives has high switching current requirements (and therefore high power requirements), the power savings may be inconsequential or at best unsubstantial. Therefore, simply stated, any EEPROM which is to be considered a universal memory requires low switching current.

Yet another requirement of a EEPROM universal memory is high thermal stability of the information stored therein. Today's computers, especially personal computers, are routinely subjected to high temperatures. These high temperatures can be caused by internally created heat such as from power sources or other heat producing internal components. These high temperatures may also be caused by environmental factors, such as use of the computer in a hot climate or storage of the computer in an environment which is directly or indirectly heated to higher than normal temperatures. Regardless of the cause of the elevated temperatures, present computer memory systems, especially "hard" or archival memory, must be thermally stable even at relatively high temperatures. Without thermal stability, data loss may occur leading to the aforementioned loss of credibility.

Accordingly, any EEPROM replacement requires a thermal stability at least comparable to that of the present memory systems.

It is the principal object of the instant invention to develop memory elements characterized by low switching currents and high thermal stability of stored data. This is accomplished by modifying the novel memory materials which were first described in the parent and grandparent patent applications and upon which the instant disclosure is based.

SUMMARY OF THE INVENTION

There is disclosed herein a fundamentally new solid state, directly overwritable, electronic, non-volatile, high density, low cost, readily manufacturable, single cell memory element having reduced switching current requirements and greater thermal stability of data stored therein. These memory elements utilize a unique class of chalcogenide memory materials in new compositional configurations. The unique memory materials exhibit orders of magnitude higher switching speeds at remarkably reduced energy levels. The novel memory materials, of which the memory elements and arrays of the instant invention are formed, are characterized, inter alia, by stable and truly non-volatile detectable configurations of local atomic and/or electronic order which can be selectively and repeatably established by electrical input signals of varying pulse voltage, current and duration. The memory devices of the instant invention are therefore switchable between atomic and/or electronic configurations of different local order in a single crystalline state so as to provide at least two stable settings.

While these memory materials are being intensively investigated, no theory has yet explained the extraordinary electrical switching behavior observed. Specifically, the subject semiconductor materials can be switched between numerous electrically detectable conditions in nanosecond time periods with the input of picojoules of energy. The subject memory materials are truly non-volatile and can be cycled (written and rewritten) almost indefinitely while maintaining the integrity of the information stored by the memory cell without the need for periodic refresh signals. The subject memory material is directly overwritable so that information stored in other memory elements need not be erased (as is required with ferro-electric and other flash storage systems) in order to change information stored in a given set of memory elements. Further, memory configurations utilizing the novel materials of the instant invention are set forth in which the bit density of the memory element has been greatly increased over prior art configurations.

One embodiment of the present invention comprises an electrically operated, directly overwritable, multibit, single-cell memory element. The memory element includes a volume of memory material which is comprised of at least one chalcogen element and at least one transition metal element. In a previous invention, the transistion metal element could be selected from the group consisting of Cr, Fe, Ni and mixtures or alloys thereof. In the instant invention, the transition metal element can be selected from the additional group consisting of Nb, Pd, Pt and mixtures or alloys thereof.

Other embodiments and features of the present invention as well as other advantages and objects thereof will be set forth and become apparent from the detailed description of the invention which follows hereinafter, especially when taken in combination with the accompanying drawings.

DETAILED DESCRIPTION OF THE INVENTION

In the past, erasable electrical memories have been fabricated from chalcogenide materials. However, these prior an materials employed structural changes that were accommodated by the movement of certain atomic species within the material to permit change of phase as the material switched from the amorphous state to the crystalline state. For example, in the case of electrically switchable chalcogenide alloys formed of tellurium and germanium, such as those comprising about 80% to 85% tellurium and about 15% germanium along with certain other elements in small quantities of about one to two percent each, such as sulfur and arsenic, the more ordered or crystalline state was typically characterized by the formation of a highly electrically conductive crystalline Te filament within the switchable pore of the memory material. A typical composition of such a prior art material would be, for example, $Te_{81}Ge_{15}S_2As_2$ or $Te_{81}Ge_{15}S_2Sb_2$. Because Te is so highly conductive in its crystalline state, a very low resistance condition was established through the Te filament in the more ordered or crystalline state; this resistance being a number of orders of magnitude lower than the resistance of the pore in the less ordered or amorphous state.

However, the formation of the conductive Te filament in the crystalline state required migration of the Te atoms from their atomic configuration in the amorphous state to the new locally concentrated atomic configuration in the crystalline Te filament state. Similarly, when the chalcogenide filamentary material was switched back to the amorphous state, the Te which had precipitated out into the crystalline filament was required to migrate within the material from its locally concentrated form in the filament back to its atomic configuration in the amorphous state. This atomic migration, diffusion or rearrangement between the amorphous and crystalline states required in each case a holding or dwell time of sufficient length to accommodate the migration, thereby making the requisite switching time and energy relatively high.

The subject inventor has now discovered certain new principles which permit a remarkable reduction in both the required switching time and the energy input for an improved and fundamentally different type of electrically erasable, directly overwritable memory primarily based on a new class of chalcogenide semiconductor materials. Moreover, the phenomenologically distinct chalcogenide materials of the instant invention are based on fundamentally new physics, the operation of which, although not fully understood, provides for switching either within a wide dynamic range of stable states within a given crystalline lattice structure or between different crystalline states with remarkably low energy inputs at remarkably fast speeds so that this newly discovered class of semiconductor materials can be used to fabricate improved electrical memory elements. In operation, these novel materials are based upon the ability to create a very high, non-volatile and modulatable concentration of free charge in a narrow band gap semiconductor material in which the band gap can be tailored. These materials are different than both conventional amorphous and crystalline materials in that the crystallites resemble the more disordered amorphous state and heavily influence the electronic conductivity of the switch.

Specifically, the memory material of the present invention can be switched between numerous electrically detectable conditions of varying resistance in nanosecond time periods with the input of picojoules of energy. This memory material is non-volatile and will maintain the integrity of the information stored by the memory cell (within a selected margin of error) without the need for periodic refresh signals. In contrast to many other semiconductor materials and systems heretofore specified for memory applications, the semiconductor memory material and systems of the present invention are directly overwritable so that the discrete memory elements need not be erased (set to a specified starting point) in order to change information stored there. Experimental evidence indicates that the remarkably fast and low energy switching to any of the different values of resistance can be attributed to the fact that said switching occurs without the need for gross atomic rearrangement of the switching material. Our current understanding suggests that the memory alloy material is present in a microcrystalline phase and experimental evidence also demonstrates the existence of some correspondence between crystallite size of the microcrystalline semiconductor material described herein and the ability of that material to quickly assume stable states upon the application of a low energy signal, Although specific examples of semiconductor materials adapted for, inter alia, memory usage are described below, the memory element of the present invention can be fabricated from any body of semiconductor material which meets the requirement of modulatable free charge concentration by shifting the Fermi level position relative to a band edge, Particularly, for the newly discovered family of semiconductor materials as applied to electrical memories, the result is high-speed, low-energy, direct-overwrite operation. The volume of memory material which is included in the memory elements of the present invention is formed from a plurality of constituent atomic elements, each of which is present throughout the entire volume. The plurality of constituent atomic elements includes at least one chalcogen element and at least one transition metal element. The term "transition metal" as used herein includes elements 21 to 30, 39 to 48, 57 and 72 to 80, More preferably, the plurality of constituent atomic elements which form the volume of memory material include Te, Se, Ge, Sb, Bi, Pb, Sn, As, S, Si, P, O and mixtures or alloys thereof. More preferably the transition metal includes Cr, Fe, Ni, Pd, Pt, Nb and mixtures of alloys thereof and the chalcogen element includes Te and Se. Most preferably the transition metal is Pd. Specific examples of such multi-element systems are set forth hereinafter with respect to the Te:Ge:Sb system with Ni and/or Se.

As is well known to those skilled in the art, chalcogenide semiconductor materials, like other semiconductors, are characterized by a forbidden energy zone or band gap separating their conduction and valence bands (see the "Cohen, Fritzsche, Ovshinsky model" describing the mobility gap of chalcogenide semiconductor materials). The Fermi level position, i.e., the energy at which the probability of occupancy of an energy level is 50%, determines, in part, the electrical conductivity of the semiconductor material and, as it is moved to substantially different positions in the band gap, a large dynamic range of electrical conductivities become possible. Regardless of the explanation of the manner in which this memory material operates, the present invention provides a combination of valuable electrical switching characteristics never before available in a single memory element. It must be pointed out that experimental results have demonstrated that the chalcogenide compositions, investigated to date, employ hole conduction.

Since the specific semiconductor alloys employed in fabricating the memory devices include chalcogenide elements. Compounds/alloys of the chalcogenides are particularly noted for the presence of "lone pair" electrons. It is, therefore, necessary to discuss the effect and nature of those lone pair electrons in available chemical bonding configurations. Simply stated, a lone pair is a pair of electrons in the valence shell of an atom that is typically not engaged in bonding. Such lone pair electrons are important both structurally and chemically. They influence the shape of molecules and crystalline lattice structures by exerting strong repulsive forces on neighboring electron pairs which are engaged in bonding configurations and as well as on other lone pairs, Since lone pair electrons are not fled down into a bonding region by a second nucleus, they are able to influence and contribute to low energy electronic transitions. As first pointed out by Ovshinsky, the lone pairs can have 1 and 3 center bonding and as demonstrated by Kastner, Adler and Fritzsche, they have value alternation pairs.

Specifically, the tellurium alloys described herein have a valence band made up of lone pair states. Since four (4) p shell electrons are present in Te, and the Te atom is chemically bonded by two of these bonding electrons in the p shell, the other two outer electrons (the lone pair) are not utilized for bonding purposes and hence do not substantially change the atomic energy of the system. In this regard, note that the highest filled molecular orbital is the orbital which contains the lone pair electrons. This is significant because, in a perfect stoichiometric crystal of tellurium and germanium atoms, upon the application of some internal strain in the lattice from which the crystallite is formed, the valence band can broaden and move upward toward the position of the then existing Fermi level, However, TeGe crystals are naturally "self-compensated", that is, the crystal desires to preferentially assume a Te rich (52 percent Te and 48 percent Ge) composition. The stoichiometric crystal is a face centered cube; however, with the addition of a minimal amount of energy, the crystal can assume a rhombohedral lattice structure by increasing the number of its Ge and/or Sb vacancies. It is this creation of vacancies in the crystalline lattice structure, which can reduce lattice strain in TeGe alloys, lowers the energy state of the material and moves the Fermi level toward the valence band.

Although we have only demonstrated the existence of stable intermediates values of resistance in the rhombohedral crystal structure, the system is microcrystalline in which the grain size is very small and the surface skin may play a very significant role. It is therefore acceptable, if not essential to superimpose an amorphous model of local order on top of a short range local order model for the purpose of obtaining a descriptive, if not perfectly predictive explanation of atomic behavior. When considering the amorphous nature of the material, note that the density of defect states in the band tails is greatest adjacent the band edges, while the depth of the recombination centers for captured charge carriers are deeper farther away from the band edges. The presence of these deep traps and tail states would provide a possible explanation for intermediate stable resistance values between the Fermi level position and the band edge. Regardless of theory, the semiconductor material of the instant invention is a degenerate semiconductor which exhibits metallic-like conduction.

It is further believed that the size of the crystallites which exist in the bulk of the semiconductor and memory material of the present invention is relatively small, preferably less than about 2000 Å, more preferably between about 50 and 500 Å, and most preferably on the order of about 200 to about 400 Å. Further, these crystallites are believed to be surrounded by an amorphous skin which may contribute to the rapid formation of the many Fermi level positions of the material, detectable as different resistances (conductivities), as well as to the lower energy requirements for the transitions between these detectable resistance/reflectance values to which the material can be reliably and repeatably set.

In accordance with still another aspect of the present invention, it has been found that modulation of the switching characteristics of two or three terminal semiconductor devices fabricated from the microcrystalline materials of the present invention may be controlled such that repeatable and detectable resistance values can be effected. It has been found that, in order for the materials of the present invention to be quickly set by low energy input signals to a desired conductivity (determined by the Fermi level position), it is only necessary that said materials are capable of stable (or long lived metastable) existence with a at least two different Fermi level positions, which Fermi level positions are characterized by substantially constant band gaps but different electrical conductivities. When characterized by these properties, the device incorporating said material can be modulated so as to exhibit a desired degree of switching performance.

As noted above, it is also believed that the relatively small crystallite size may contribute to the rapid transition between detectable values of resistance. It has now been postulated that a microcrystalline lattice structure switches more rapidly between these resistance values because the microstructures can be readily adjusted on the atomic level. For instance, when the lone pair electrons are responsible for the rapid switching, bonds with the Ge or Sb atoms do not even have to be broken by the electrical pulse in order to provide for increased electrical conductivity.

One characteristic of the semiconductor materials of the present invention is their tendency toward the formation of more and smaller crystallites per unit volume of the material. Crystallite sizes of the widest preferential range of representative materials have been found to be far less than about 2000 Å, and generally less than the range of about 2,000 to 5,000 Å which was characteristic of prior art materials. Crystallite size is defined herein as the diameter of the crystallites, or of their "characteristic dimension" which is equivalent to the diameter where the crystallites are not spherically shaped.

It has been determined that compositions in the highly resistive state of the class of TeGeSb materials which meet the criteria of the present invention are generally characterized by substantially reduced concentrations of Te relative to that present in prior art electrically erasable memory materials. In one composition of this class that provides the substantially improved electrical switching performance characteristics, the average concentration of Te in the as deposited materials was well below 70%, typically below about 60% and ranged in general from as low as about 23% up to about 58% Te and most preferably about 48% to 58% Te. Concentrations of Ge were above about 5% and ranged from a low of about 8% to about 40% average in the material, remaining generally below 50% Ge, with the remainder of the principal constituent elements in this composition being Sb. The percentages given are atomic percentages which total 100% of the atoms of the constituent elements. Thus, this composition may be characterized as $Te_aGe_bSb_{100-(a+b)}$, where a is equal to or less than about 70% and preferably between about 48% to about 58%, b is above about 5% and less than 50%, preferably between about 8% to about 40% and the remainder is Sb. These ternary Te—Ge—Sb alloys, in addition to being very useful memory materials, prove to be very useful as starting materials for the development of additional memory materials having even better electrical characteristics.

Figure 5:
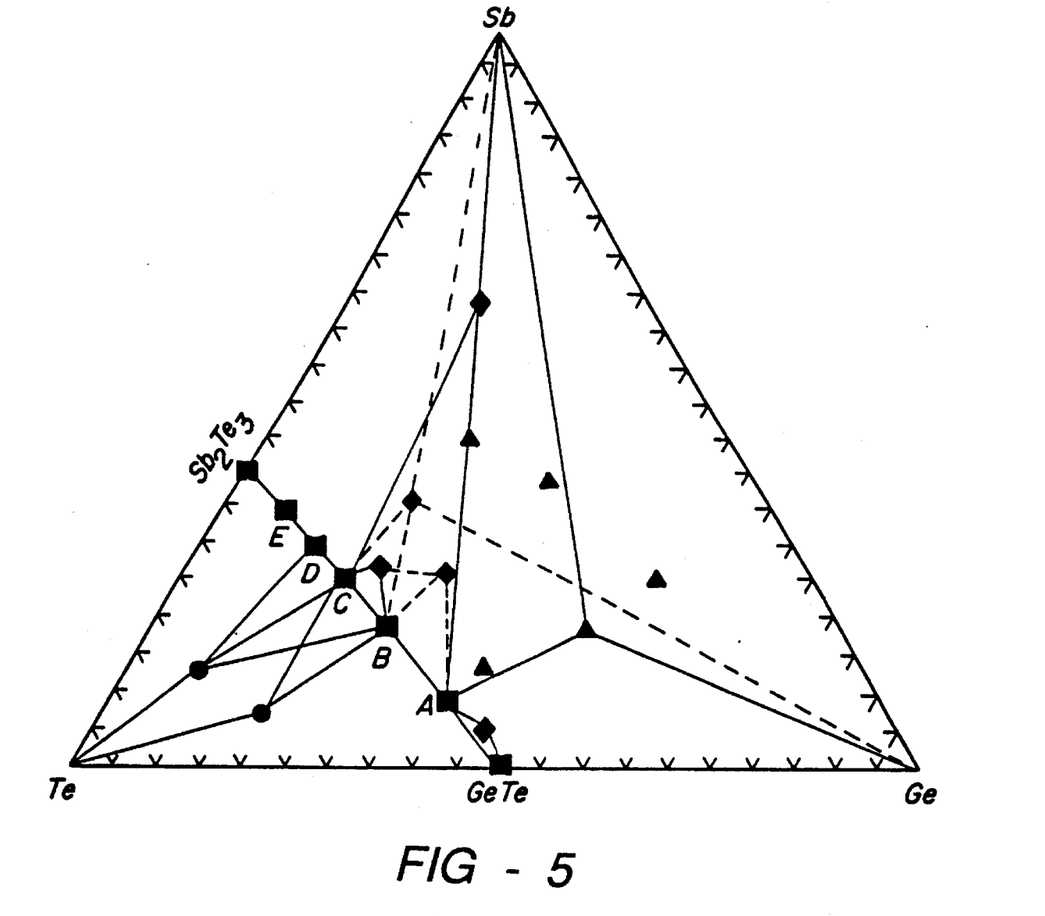
FIG. 5 is a ternary phase diagram of the Ge:Sb:Te alloy system which form the major component of the memory elements of the instant invention, said phase diagram showing the multiple phases into which various mixtures of these elements segregate upon rapid solidification.

A ternary diagram of the Te:Ge:Sb system is shown in FIG. 5. Melts were prepared from various mixtures of Te, Ge and Sb. Analysis of these rapidly solidified melts indicated the presence of ten different phases (not all present in any one rapidly solidified melt). These phases are: elemental Ge, Te and Sb, the binary compounds GeTe, and $Sb_2Te_3$ and five different ternary phases. The elemental compositions of all of the ternary phases lie on the pseudobinary GeTe—$Sb_2Te_3$ line and are indicated by the reference letters A, B, C, D and E on the ternary diagram shown in FIG. 5. The atomic ratios of the elements in these five ternary phases are set forth in Table 1. A more detailed description of FIG. 5 is presented hereinbelow.

TABLE 1

Observed Ternary Crystalline Phases of the TeGeSb System

| Designation | At % Ge | At % Sb | At % Te |
| --- | --- | --- | --- |
| A | 40 | 10 | 50 |
| B | 26 | 18 | 56 |
| C | 18 | 26 | 56 |
| D | 14 | 29 | 57 |
| E | 8 | 35 | 56 |

The novel memory elements of the present invention include a volume of memory material, said memory material including at least one chalcogenide and at least one transition metal. These improved memory materials are elementally modified forms of our previously disclosed memory materials in the Te—Ge—Sb ternary system. That is, the memory materials of the present invention constitute elementally modified forms of the Te—Ge—Sb memory alloys disclosed in the parent and grandparent of the instant application. This elemental modification is achieved by the incorporation of transition metals into the basic Te—Ge—Sb ternary system, with or without an additional chalcogen element, such as Se. Generally the present memory materials fall into two categories.

The first category is a memory material which includes Te, Ge, Sb and a transition metal, in the ratio $(Te_aGe_bSb_{100-(a+b)})_cTM_{100-c}$ where the subscripts are in atomic percentages which total 100% of the constituent elements, wherein TM is one or more transition metals, a and b are as set forth herein above for the basic Te—Ge—Sb ternary system and c is between about 90 and about 99.99%. The transition metal preferably includes Cr, Fe, Ni, Nb, Pd, Pt and mixtures or alloys thereof.

Specific examples of memory materials encompassed by this system would include $(Te_{56}Ge_{22}Sb_{22})_{95}Ni_5$, $(Te_{56}Ge_{22}Sb_{22})_{90}Ni_{10}$, $(Te_{56}Ge_{22}Sb_{22})_{95}Cr_5$, $(Te_{56}Ge_{22}Sb_{22})_{90}Cr_{10}$, $(Te_{56}Ge_{22}Sb_{22})_{95}Fe_5$, $(Te_{56}Ge_{22}Sb_{22})_{90}Fe_{10}$, $(Te_{56}Ge_{22}Sb_{22})_{95}Pd_5$, $(Te_{56}Ge_{22}Sb_{22})_{90}Pd_{10}$, $(Te_{56}Ge_{22}Sb_{22})_{95}Pt_5$, $(Te_{56}Ge_{22}Sb_{22})_{95}Pt_{10}$, $(Te_{56}Ge_{22}Sb_{22})_{95}Nb_5$, $(Te_{56}Ge_{22}Sb_{22})_{90}Nb_{10}$, $(Te_{56}Ge_{22}Sb_{22})_{90}Ni_5Cr_5$, $(Te_{56}Ge_{22}Sb_{22})_{90}Ni_5Fe_5$, $(Te_{56}Ge_{22}Sb_{22})_{90}Cr_5Fe_5$, $(Te_{56}Ge_{22}Sb_{22})_{90}Pd_5Cr_5$, $(Te_{56}Ge_{22}Sb_{22})_{90}Ni_5Pd_5$, $(Te_{56}Ge_{22}Sb_{22})_{90}Pd_5Pt_5$, etc.

The second category is a memory material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements, TM is one or more transition metals, a and b are as set forth hereinabove for the basic Te—Ge—Sb ternary system, c is between about 90 and 99.5% and d is between about 0.01 and 10%. The transition metal can preferably include Cr, Fe, Ni, Pd, Pt, Nb and mixtures of alloys thereof. Specific examples of memory materials encompassed by this system would include $(Te_{56}Ge_{22}Sb_{22})_{90}Ni_5Se_5$, $(Te_{56}Ge_{22}Sb_{22})_{80}Ni_{10}Se_{10}$, $(Te_{56}Ge_{22}Sb_{22})_{90}Cr_5Se_5$, $(Te_{56}Ge_{22}Sb_{22})_{80}Cr_{10}Se_{10}$, $(Te_{56}Ge_{22}Sb_{22})_{90}Fe_5Se_5$, $(Te_{56}Ge_{22}Sb_{22})_{80}Fe_{10}Se_{10}$, $(Te_{56}Ge_{22}Sb_{22})_{90}Pd_5Se_5$, $(Te_{56}Ge_{22}Sb_{22})_{80}Pd_{10}Se_{10}$, $(Te_{56}Ge_{22}Sb_{22})_{90}Pd_5Se_5$, $(Te_{56}Ge_{22}Sb_{22})_{80}Pt_{10}Se_{10}$, $(Te_{56}Ge_{22}Sb_{22})_{90}Nb_5Se_5$, $(Te_{56}Ge_{22}Sb_{22})_{80}Nb_{10}Se_{10}$, $(Te_{56}Ge_{22}Sb_{22})_{85}Ni_5Cr_5Se_5$, $(Te_{56}Ge_{22}Sb_{22})_{80}Ni_5Fe_5Se_{10}$, $(Te_{56}Ge_{22}Sb_{22})_{85}Cr_5Fe_5Se_5$, $(Te_{56}Ge_{22}Sb_{22})_{85}Ni_5Pd_5Se_5$, $(Te_{56}Ge_{22}Sb_{22})_{80}Ni_5Pt_5Se_{10}$, $(Te_{56}Ge_{22}Sb_{22})_{85}Ni_5Nb_5Se_5$, $(Te_{56}Ge_{22}Sb_{22})_{85}Pd_5Cr_5Se_5$, $(Te_{56}Ge_{22}Sb_{22})_{80}Pd_5Pt_5Se_{10}$, $(Te_{56}Ge_{22}Sb_{22})_{85}Pd_5Nb_5Se_5$, $(Te_{56}Ge_{22}Sb_{22})_{85}Pt_5Nb_5Se_5$, etc.

The memory elements of the instant patent application appear to possess non-volatile set resistance values. However, if the resistance value of the instant memory elements does, under some circumstances, drift from its original set value, "compositional modification", first presented in the parent of the instant application and also described and incorporated hereinafter by reference, may be used to compensate for this drift. As used herein, the use of the term "non-volatile" when referring to the electrical memory of the present invention will refer to the condition in which the set resistance value remains substantially constant for archival time periods without losing the integrity of information stored therein. Of course, software (including the feedback system discussed hereinafter) can be employed in conjunction with the memory elements of the present invention to insure that absolutely no "drift" occurs outside of the selected margin of error. Because drift of the resistance value of the memory elements can, if left unimpeded, hinder gray scale storage of information, it is desirable to minimize drift.

In the most general sense "compositional modification" is defined to include any means of compositionally modifying the volume of memory material to yield substantially stable values of resistance, including the addition of band gap widening elements to increase the inherent resistance of the material. One example and a preferred embodiment of compositional modification is forming the volume of memory material so as to include graded compositional inhomogeneities with respect to thickness. For instances, the volume of memory material may be graded from a Te—Ge—Sb alloy at one side of the material to a Te—Ge—Sb alloy of differing composition at the opposite side. The compositional grading may take on any form which produces the desired result, (i.e. reduced set resistance value drift). For example, the compositional grading need not be limited to a first and second alloy of the same alloy system. Also, the grading can be accomplished with more than two alloys. The grading can be uniform and continuous but can also be non-uniform or non-continuous. In essence, any form of compositional grading which produces a memory element characterized by substantially stable resistance over time can be employed. A specific example of compositional grading which results in reduced drift of resistance is a volume of memory material which includes a uniform and continuous grading of $Ge_{14}Sb_{29}Te_{57}$ at one surface to $Ge_{22}Sb_{22}Te_{56}$ at the opposite surface.

Another manner of employing compositional modification to reduce resistance drift is by layering the volume of memory material. That is, the volume of memory material may be formed of a plurality of discrete, relatively thin layers of differing composition. For example, the volume of memory material may include one or more pairs of layers, each one of which is formed of a different Te—Ge—Sb alloy. Again, as was the case with graded compositions, any combination of layers which results in substantially reduced resistance value drift can be employed. The layers may be of similar thickness or they may be of differing thickness. Any number of layers may be used and multiple layers of the same alloy may be present in the volume of memory material, either contiguous or remote from one another. Also, layers of any number of differing alloy composition may be used. A specific example of compositional layering is a volume of memory material which includes alternating layer pairs of $Ge_{14}Sb_{29}Te_{57}$ and $Ge_{22}Sb_{22}Te_{56}$.

Yet another form of compositional inhomogeneity to reduce resistance drift is accomplished by combining compositional grading and compositional layering so as to form the volume of memory material. More particularly, the aforementioned compositional grading may be combined with any of the above described compositional layering techniques to form a stable volume of memory material. Exemplary volumes of memory material which employ this combination are: (1) a volume of memory material which includes a discrete layer of $Ge_{22}Sb_{22}Te_{56}$ followed by a graded composition of $Ge_{14}Sb_{29}Te_{57}$ and $Ge_{22}Sb_{22}Te_{56}$ and (2) a volume of memory material which includes a discrete layer of $Ge_{14}Sb_{29}Te_{57}$ and a graded composition of $Ge_{14}Sb_{29}Te_{57}$ and $Ge_{22}Sb_{22}Te_{56}$.

Figure 1:
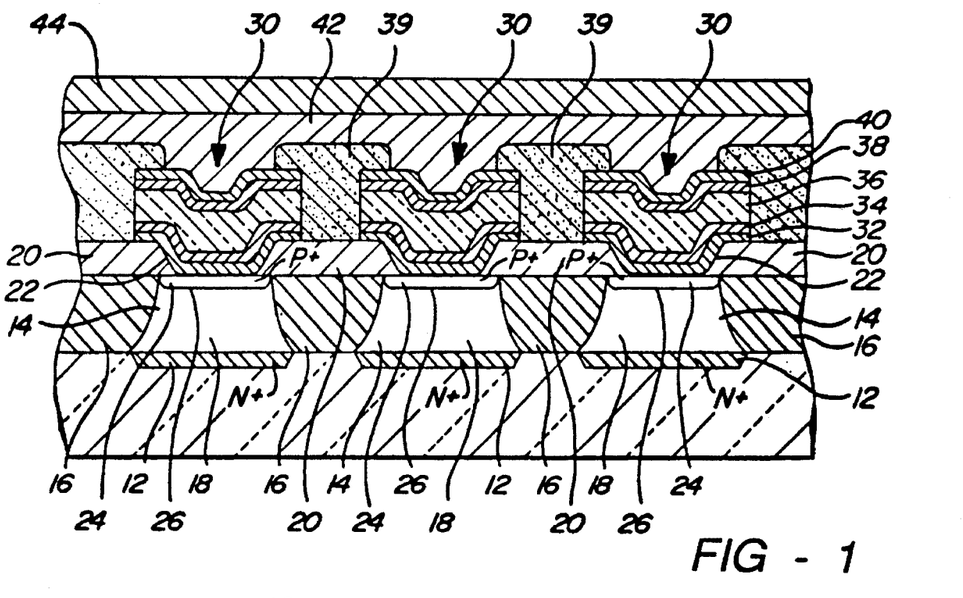
FIG. 1 is a fragmentary cross-sectional view illustrating a portion of an integrated circuit, said circuit depicting an electrically erasable and directly overwritable multilevel memory configuration of a first preferred embodiment of the present invention.

Referring now to FIG. 1, there is shown a cross-sectional view of a portion of the structure of an electrically erasable memory of the present invention formed on a single crystal silicon semiconductor wafer 10 which is p-doped and which forms a p-substrate for the deposition of the remaining elements of the configuration illustrated. Formed in the p-substrate 10 are n+ channels 12, which may be diffusion doped in a manner well known in the art. These n+ channels extend across the chip in a direction perpendicular to the plane of the illustration and form one set of electrodes, in this case the y set, of an x-y electrode grid for addressing the individual memory elements.

On top of this n+ grid structure is formed an n-doped crystalline epitaxial layer 14, again by techniques well known in the art. The n doped epitaxial layer 14 may be about 5,000 Å thick, for example. Using known masking and doping techniques, p-doped isolation channels 16 are then formed in the n-epitaxial layer 14. These p-doped isolation channels 16 extend all the way down to the p substrate 10 as shown in FIG. 1 and also extend completely around and isolate and define islands 18 of the n-epitaxial layer 14. The islands 18 are shown more clearly in the top view of FIG. 2 wherein the p isolation channels are shown as forming an isolation grid defining and isolating the islands 18 of n epitaxial material. Instead of the p-doped isolation channels, $SiO_2$ isolation trenches may be used for isolation of the islands 18. The technique of formation of such $SiO_2$ isolation trenches is well known to those skilled in the art. A layer 20 of thermally grown $SiO_2$ is then formed on the structure just described and etched to form apertures 22 over the islands 18. Diffusion regions 24 of p+ material are then formed within the areas defined by the apertures 22 as shown in FIG. 1. The semiconductor junctions of the p+ regions and the n epitaxial layer define p-n junction diodes 26 in series with each of the regions of the n epitaxial layer exposed through the apertures 22 of the $SiO_2$ layer 20.

The memory elements 30 are then deposited over the p+ regions 24 in individual ohmic electrical series contact with the diodes 26. The memory elements 30 comprise bottom thin electrical contact layers of high corrosion resistance metal (such as, for example, molybdenum) 32 and electrically conductive diffusion barrier layer (such as, for example, carbon) 34, the memory layer 36 formed of a material as described above, and upper thin electrical contact layers of high corrosion resistance material 40 of molybdenum and electrically conductive diffusion barrier layer 38 of carbon. The contact layers 32, 34, 38 and 40 of carbon and molybdenum form excellent electrical contacts with the memory layers 36 and the carbon also forms a diffusion barrier which effectively blocks diffusion of the molybdenum metal and/or optional external contact grid material contact into the volume of chalcogenide memory material 36. The carbon layers 34 and 38 have a relatively high electrical resistivity and are more difficult to etch and are therefore preferably relatively thin, typically in the range of 100 to 1,000 Å or so. The molybdenum layers 32 and 40 should be thicker, in the range of 1,000 to 2,000 Å or so.

The layer of memory material 36 is formed of a multi-element semiconductor material, such as the chalcogenide materials disclosed herein. The layer 36 may be deposited by methods such as sputtering, evaporation or by chemical vapor deposition (CVD), which may be enhanced by plasma techniques such as RF glow discharge. The chalcogenide memory materials of the instant invention are most preferably made by RF sputtering and evaporation. Typical deposition parameters for RF sputtering and evaporation of the chalcogenide layer 36 are set forth below in Tables 2 and 3, respectively.

TABLE 2

RF Sputtering Deposition Parameters

| Parameter | Typical Range |
|---|---|
| Base pressure | $8\times10^{-7}$–$1\times10^{-6}$ Torr |
| Sputtering gas (Ar) pressure | 4–8 m Torr |
| Sputtering power | 40–60 watts |
| Frequency | 13–14 MHz |
| Deposition Rate | 0.5–10 Å/second |
| Deposition Time | 2–25 minutes |
| Film Thickness | 250–1500 Å |
| Substrate Temp. | Ambient–300° C. |

TABLE 3

Evaporation Deposition Parameters

| Parameter | Typical Range |
|---|---|
| Base pressure | $1\times10^{-6}$–$5\times10^{-6}$ Torr |
| Evaporation Temp. | 450–600° C. |
| Deposition Rate | 2–4 Å/second |
| Deposition Time | 2–20 minutes |
| Film Thickness | 250–1500 Å |
| Substrate Temp. | Ambient–300° C. |

Experimental data obtained by analyzing thin films deposited pursuant to the evaporation parameters set forth in Table 3 demonstrates that the Fermi level position for the fcc phase has been moved adjacent the edge of the valence band (i.e. the fcc phase behaves as a semi-metal with zero eV activation energy). Note that the "as deposited" evaporated films are amorphous and subsequently subjected to an anneal in order to obtain the crystalline face centered cubic lattice structure. In contrast thereto, the Fermi level positions for the hexagonal crystal structure (which is achieved through the input an additional electrical pulse) have been actually moved into the valence band (i.e., the positions exhibit "degenerate semiconductor" behavior in which the hexagonal phase behaves as a metal). The reasons for the differences in switching behavior which exist between thin films deposited by sputtering, vis-a-vis, those deposited by evaporation, are not entirely understood. Experimental evidence demonstrates that impurities caused by the presence of oxygen in the sputtered film are responsible for the differences in the Fermi level positions. However, it is noteworthy that oxygen was present in the cathode target material. Its presence was later analytically discovered. It is also important to note that evaporated films deposited on a heated substrate will exhibit anisotropic growth characteristics (see the description of FIG. 6) in which oriented layers of the chalcogenide elements are successively deposited. Whether this proves to be significant for electrical applications has yet to be proven; however, this type of film holds a great deal of promise for other fields such as thermoelectricity (due to the high thermopower already measured for these compositions, i.e., a factor of four greater than that measured for bismuth systems) or for specific semiconductor and superconductivity applications.

The layer of memory material 36 is preferably deposited to a thickness of about 200 Å to about 5,000 Å, more preferably of about 250 Å to about 2,500 Å and most preferably of about 400 Å to about 1,250 Å in thickness. The lateral dimension or diameter of the pore of semiconductor material 36 may be in the range of less than about one micrometer, although there is no practical limit on the lateral dimension. It has been determined that the diameter of the actual conductive path of the high conductivity material is significantly less than a micrometer. The pore diameter can thus be as small as lithography resolution limits will permit and, in fact, the smaller the pore, the lower the energy requirements for electrical switching.

In a preferred embodiment of the present invention, the pore diameter is selected such that it conforms substantially with the diameter of the low resistance path which is formed when the material is switched to the low resistance state. The diameter of the pore of memory material 36 is therefore preferably less than about one micrometer so that the volume of the memory material 36 is limited, to the extent lithographically possible, to the volume of the material 36 which is actually switched between the various states of resistance. This further reduces the switching time and the electrical energy required to initiate the detectable change in resistance. The term "pore diameter" as used herein shall mean the lateral cross-sectional dimension of the layer of memory material 36 which extends under the contact regions formed with the memory layer 36 and with the lower p+ layer and the upper conductors 42 as shown in the embodiment of FIG. 1. It is further preferred that the pore regions of the memory elements 30 be thermally isolated and/or controlled except for such electrical contact with the upper and lower electrodes as is necessary for proper operation of the memory elements. This further confines, limits and controls the heat transfer from the switched volume of the pore and the electrical energy required for the resistance transitions. This is accomplished in the embodiment of FIG. 1 by the oxide layers 20 and 39 which surround the lateral peripheral portions of the memory elements 30. Accordingly, in order to minimize set energy/current/voltage, small pore diameters of as low as 250 Å may be employed.

The layers 32, 34, 36, 38 and 40 are etched and an oxide layer 39 is formed thereover and etched to leave openings above the memory elements 30 as shown. Alternatively, the memory elements may be formed in a two step etch process with layers 32 and 34 being first deposited and then etched over the top of which the remaining layers 36, 38 and 40 are deposited and then separately etched to the selected dimension. Deposited on top of the entire structure formed by layers 32, 34, 36, 38, and 40 is the second electrode grid structure formed of aluminum conductors 42, which extend perpendicular in direction to the conductors 12 and complete the x-y grid connection to the individual memory elements. Overlaying the complete integrated structure is a top encapsulating layer 44 of a suitable encapsulant such as $Si_3N_4$ or a plastic material such as polyamide, which seals the structure against moisture and other external elements which could cause deterioration and degradation of performance, particularly of the phase change materials in the memory layer 36. The $Si_3N_4$ encapsulant can be deposited, for example, using a low temperature plasma deposition process. The polyamide material can be spin deposited and baked after deposition in accordance with known techniques to form the encapsulant layer 44.

Parallel processing and therefore multidimensional memory array structures are required for rapid performance of complex tasks such as pattern recognition, classification or associative learning etc. Further uses for and description of parallel processing are presented in U.S. patent application Ser. No. 594,387, filed Oct. 5, 1990, which is assigned to the assignee of the instant application and the disclosure of which is hereby incorporated by reference. With the integrated structure as shown in the embodiment of FIG. 1; however, a completely vertically integrated structure of the memory element and its isolating diode is formed, thus minimizing the area occupied on the substrate by each of the combinations of memory elements and diodes. This means that the density of the memory elements in the chip is limited essentially only by the resolution capabilities of the lithography.

Figure 2:
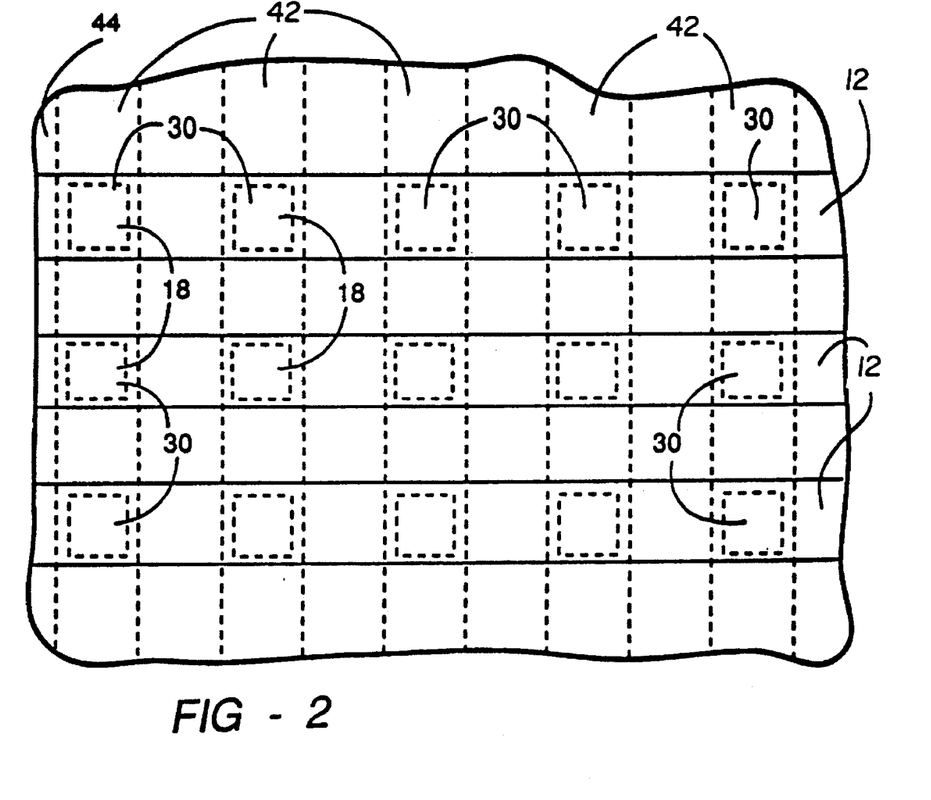
FIG. 2 is a top plan view schematically illustrating a portion of the integrated circuit configurations of FIG. 1.

The integrated structure thus formed is an x-y memory matrix connected as shown in FIG. 2 in which each memory element 30 is connected in series with a diode 26 between a horizontal x-line 42 and a vertical y-line 12. The diodes 26 serve to electrically isolate each of the memory elements 30. Other circuit configurations for the electrically erasable memory of the present invention are, of course, possible and feasible to implement. One particularly useful configuration is a three dimensional, multilevel array in which a plurality of planes of memory or control elements and their respective isolation devices are stacked upon one another. Each plane of memory elements is arranged as a plurality of rows and columns of memory elements, thereby allowing for X-Y addressing. This stacking of planes, in addition to increasing memory storage density, allows for an additional Z dimension of interconnection. This arrangement is particularly useful to simulate a neural network for a truly intelligent computer.

Figure 3:
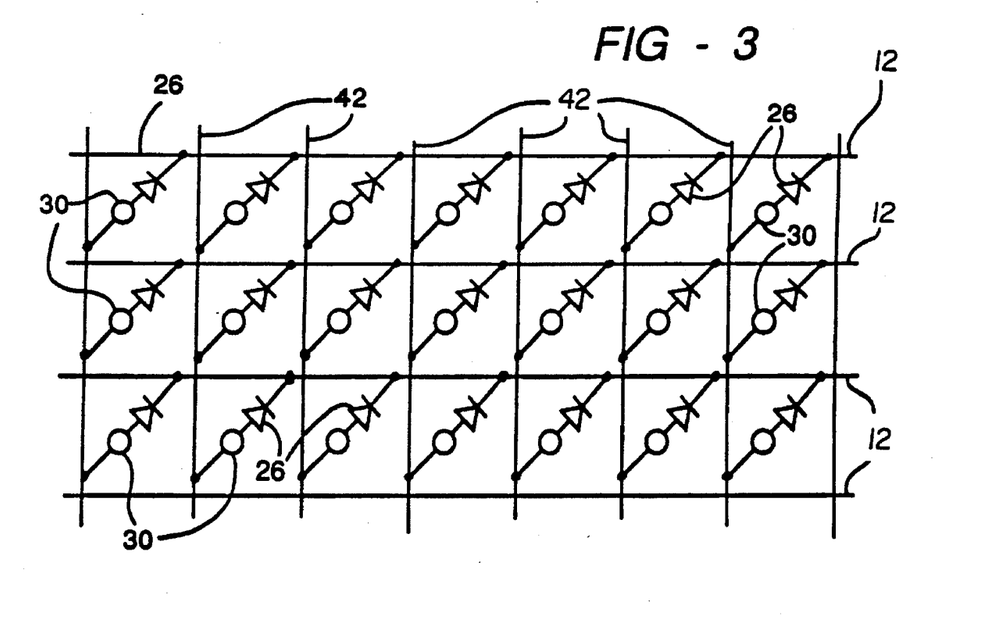
FIG. 3 is a schematic circuit diagram illustrating a portion of the X-Y matrix array of isolation elements in combination with the memory elements of the integrated circuit configurations of FIG. 1.

FIG. 3 is a stylized, schematic circuit diagram of a portion of the memory cell embodiments of FIG. 1. The circuit comprises an x-y grid with each of the memory elements 30 being electrically interconnected in series with an isolation diode 26 at the cross points of the x address lines 42 and the y address lines 12 as shown. The address lines 12 and 42 are connected to external addressing circuitry in a manner well known to those skilled in the art. The purpose of the x-y matrix of memory elements in combination with isolation elements is to enable each one of the discrete memory elements to be read and written without interfering with information stored in adjacent or remote memory elements of the matrix.

Figure 4:
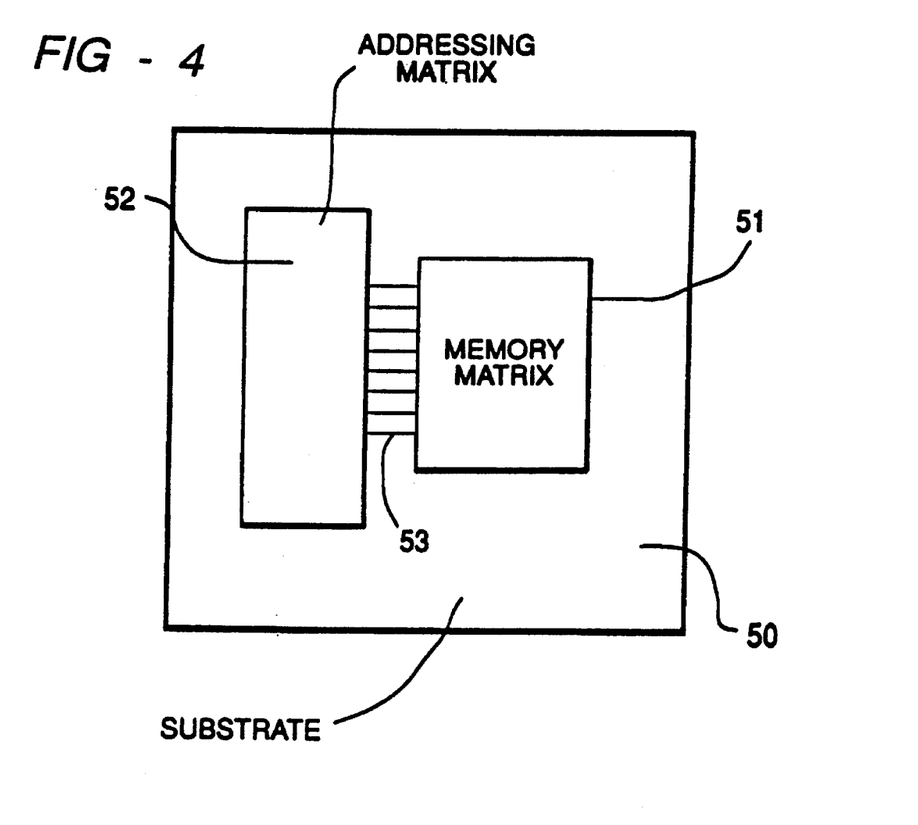
FIG. 4 is a schematic representation illustrating a single crystal semiconductor substrate with the integrated memory matrix of the instant invention, as depicted in FIG. 1, placed in electrical communication with an integrated circuit chip on which the address/drivers/decoders are operatively affixed.

In FIG. 4, them is diagrammatically illustrated a portion of a single crystal semiconductor substrate 50 with a matrix of memory elements 51 of the present invention formed thereon. Also formed on the same substrate 50 is an addressing matrix 52 which is suitably connected by integrated circuitry connections 53 to the memory matrix 51. The addressing matrix 52 includes signal generating means which define and control the setting and reading pulses applied to the memory matrix 51. Of course, the addressing matrix 52 may be integrated with and formed simultaneously with the solid state memory matrix 51.

In prior art semiconductor memories having the relatively high switching speeds and low switching energies deemed necessary for most applications thereof, at least one transistor and one capacitor is required for the operation of each memory element. The formation of such memories in integrated circuit form requires at least three connections along with other complex structures which occupy a certain minimum substrate area regardless of how the integrated circuit is laid out. The integrated circuit configuration of the electrically erasable memory of the present invention requires only two connections to each memory element and these may be made vertically. Further, each memory element, complete with isolating diode and the pair of contacts for the element, is itself fully vertically integrated such that a significantly higher bit density is possible with respect to that possible with prior art integrated circuits performing the same or similar functions. In fact, the memory of the present invention provides for a bit density which is greater than that attainable even in solid state dynamic random access memories (DRAMs), which are volatile and therefore lack the further advantages that the non-volatility attainable with the present invention provides. The increase in bit density attainable with the present invention translates into a corresponding reduction in manufacturing costs because of the smaller areas of the wafer occupied per bit of the integrated circuit configuration. This allows the memory of the present invention to surpass other available memories for a wider range of applications, not only in terms of electrical performance and memory storage capacity, but also in terms of cost. By comparison with prior art semiconductor memories formed of at least one transistor and a capacitor for each bit, the integrated circuit configurations of the present invention, as shown in FIG. 1, can be formed on a chip with greater bit density compared to prior art configurations using the same lithography resolution. In addition to the cost advantages that the higher bit density affords, the performance parameters of the memory in the integrated circuit configuration of the present invention are thus even further improved in that the elements are positioned closer together and lead lengths, capacitances, and other related parameters are further minimized, thereby enhancing performance.

Through the use of the novel semiconductor materials of the instant invention, the energy required to effect a change of Fermi level position and a corresponding change in electrical conductivity has been reduced by orders of magnitude. Further, it has been demonstrated in the laboratory that even the picojoule energies of the instant invention could be further reduced by reducing the thickness of the material.

The following section of the detailed description is intended to explain the manner in which the understanding of the scope and ramifications of the disclosed discovery has evolved. The history of its evolution is significant in providing a full explanation of the enabling embodiment of this invention, particularly with respect to the impact of the chalcogenide materials on the general class of electronic devices aside from and in addition to memory elements. While the novel semiconductor materials of the present invention can apply to a wide class of elements and compositions, for purposes of explanation, the discussion which follows below will deal with one specific example, i.e., a Ge—Sb—Te system.

Crystalline GeTe, grown from the melt, has a rhombohedrally distorted (88.2 degree(s) instead of a 90 degree(s) NaCl (i.e. face-centered cubic)) structure at room temperature. This structure changes to a face centered cubic structure above 400 degree(s) C. The origin of the rhombohedral distortion and, in particular, the relation of that distortion to the concentration of Ge vacancies in the highly conductive p-type GeTe is not clear yet. In this rhombohedrally distorted crystalline state, GeTe exhibits metallic conductivity $\approx 10^3$ to $10^4$ (ohm-cm)$^{-1}$. In thin film form, GeTe can be grown in the amorphous phase and at about 200 degree(s) C., crystallizes into the face centered cubic structure. This metastable face centered cubic phase is stable at room temperature because of the microcrystalline structure of the films. However, at annealing temperatures above 400 degree(s) C., the face centered cubic structure changes to the stable hexagonal or rhombohedral structure depending on Sb content.

In the ternary Ge—Sb—Te system, the substitution of Sb for Ge in GeTe results in properties similar to that of a pure GeTe crystal. In bulk form, the stable room temperature phase is the hexagonal phase, but it is believed that it changes to the face centered cubic phase at higher temperatures. When annealed, thin films of the amorphous state first crystallize into the face centered cubic phase at temperatures of about 200 degree(s) C.; however, upon annealing to higher temperature, they change into the hexagonal phase. This structural transition occurs at a temperature that depends on the specific composition of the film. The electrical properties of thin films of amorphous and crystalline Ge—Sb—Te material have been characterized. In the amorphous state, the optical band gap, from optical absorption measurements, has been shown to be insensitive to concentrations of Sb from 0 to 35 atomic % and has been measured at about 0.7 eV. The electrical activation energy of the material decreases slightly from about 0.4 eV in the amorphous GeTe system to about 0.35 eV in the $Ge_{22}Sb_{22}Te_{56}$ system.

Upon annealing, amorphous films, regardless of composition, crystallize into the face centered cubic phase. The electrical conductivity of these films increases from about $10^{-3}$ (ohm-cm)$^{-1}$ in the amorphous phase to about 1 (ohm-cm)$^{-1}$ in the face centered cubic crystalline phase. This transition occurs at approximately 180 degree(s) C. The Fermi level position for this face centered cubic lattice is about 0.18 eV which is approximately half the measured optical band gap of about 0.4 eV. Further annealing in the range of about 180 degree(s) to about 300 degree(s) C. does not change either the electrical conductivity or the optical transmission of the material. The infrared absorption, measured in the range of 1 to 50 microns is negligible, which indicates a relatively low concentration of free charge carriers in the face centered cubic structure. Thermal annealing at 350 degree(s) C. results in a further phase transition to the hexagonal crystalline lattice structure. In this state of the lattice, the electrical conductivity further increases to about 100 (ohm-cm)$^{-1}$ and a strong free carrier absorption appears following the known relation a alpha=$A\lambda^2$, where alpha is the absorption coefficient, $\lambda$ is the wavelength of incident light and A is a constant proportional to the number of free carriers. In accordance with our measurements, the optical band gap of the material does not significantly change after the phase transformation between the face centered cubic and the hexagonal states has occurred. However, a strong (approximate or equal to 25%) increase in reflectivity has been measured.

In order to cycle the novel memory element of this invention, a process is required in which a relatively high level of energy is applied to the material prior to its initial use to convert the material into a first crystalline state. The Fermi level position for this crystalline state is on the order of about 0.18 eV, which is the same as the Fermi level position reported above for the face centered cubic structure, providing for the conclusion that the material has undergone a phase transformation from the amorphous into a face centered cubic crystalline lattice structure. Also, upon the application of additional, lesser amounts of energy, the Fermi level position was lowered, which indicates that the material has undergone a further crystalline phase transformation into the hexagonal crystalline lattice phase described above. Thus, it has been established that the stable modulation of the crystallites of the microcrystalline semiconductor material of the present invention, into and through a range of different Fermi level positions, is accomplished by changing and cycling the crystalline lattice structure of the grains of this material.

The reversible change in electrical conductivity exhibited by this microcrystalline semiconductor material is provided at least within one crystalline phase of the material. This change in the value of electrical conductivity is about two orders of magnitude, which closely corresponds to the difference in the dynamic range of the resistance of the electrical memory elements of the present invention as measured in the laboratory for the bulk material.

In order to convert the material from a crystalline state such as the face centered cubic state to a state of differing resistance, it is necessary to employ a shorter, more energetic electrical pulse. This is believed to be the mechanism for electrical switching in one embodiment of the instant invention. For example, in this interpretation, a 30 nanosecond pulse is able to transform the hexagonal lattice structure in a thin film of microcrystalline chalcogenide material into the face centered cubic lattice structure. By measuring the free charge density before and after annealing, it was found that no significant free carrier absorption takes place. This suggests that crystalline films in the face centered cubic structure have a lower concentration of thermally excited free charge (holes) as opposed to the films in the hexagonal phase, which may be thought of as a p-type, highly degenerate semiconductor material (because the Fermi level has been moved adjacent to, or all the way into, the valence band).

It is noted that the end points of the dynamic range of electrical conductivities (determined by the Fermi level positions) set forth in the present invention do not necessarily correspond to a change of crystalline states between the face centered cubic and the hexagonal lattice structures. Rather, what is more significant is the fact that the material of the present invention need never revert back to the amorphous structure and, thus, the end points in the dynamic range of electrical conductivities may both result from one or more crystalline lattice structures and can therefore be attained with relatively low energy inputs and at very high speeds.

If one considers that the concentration of free charge and the structure of the crystalline lattice are to some extent uncoupled, there is a possible mechanism that could be employed to provide information helpful in understanding the presence of the multiple stable intermediate states. It is known that the presence of an external electrical field will cause charge to drift and thereby strain the lattice. The two responses are independent. In order to change the number of vacancies in the tellurium-antimony matrix, germanium and or antimony atoms have to be moved. It is possible that the response of the strained lattice during the application of an external field is to either break some bonds and create additional acceptor levels (higher concentration of holes within the lattice) or to simply move non-bonding lone pair electrons in their local environment and/or have said lone pair interact with each other to create or dissolve states in the energy gap. In any event, the end result is independent of the previous amorphous or crystalline state of the material.

Through experimentation, the inventor has shown that factors such as pore dimensions (diameter, thickness, and volume), chalcogenide composition, thermal preparation (post deposition anneal), signal pulse duration, impurities such as oxygen present in the composition, crystallite size and signal pulse waveform shape have an effect on the magnitude of the dynamic range of resistances, the absolute end-point resistances of said dynamic range, and the voltages required to set the device at these resistances. For example, relatively thick chalcogenide films (i.e. about 4000 Å) will result in higher set voltage requirements (and therefore higher current densities) while relatively thin chalcogenide layers (i.e. about 250 Å) will result in lower set voltage (and current density) requirements. Of course, the possible significance of crystallite size and, therefore, the ratio of the number of surface atoms relative to the number of bulk atoms has previously been described.

The signal pulse duration required to set the memory element to the desired resistance level likewise be dependent upon all of the foregoing factors as well as signal voltage. Typically signal pulse durations will be less than about 400 nanoseconds for setting the memory element to a low resistance value and less than about 40 nanoseconds for setting the material to a high resistance value. It is believed that the pulse durations can be significantly reduced without interfering with the operation of the memory switch. As a matter of fact, with the input of lesser amounts of energy, the cycle life of the elements can only increase.

A feedback loop which reads and, when required, adjusts the resistance of a given memory element may be incorporated into the memory systems of the instant invention. For example, a memory element may initially be set at a desired resistance; however, in time the resistance of the element may drift slightly from the value at which it was originally set. The feedback loop, in this instance, would calculate and deliver a refresh signal pulse of the required voltage and duration to the memory element to bring it back to a preselected resistance value. Also, circumstances may exist where the set pulse delivered to a memory element may not result in setting of the element at the desired resistance value. In this case the feedback loop would deliver additional signal pulses to the element until the desired resistance level is achieved. The total duration of this series of set/adjust cycles is less than about 1,000 nanoseconds and preferably less than about 500 nanoseconds. The instant inventor speculates that the materials actually operate at the extreme ends of the hexagonal lattice structure so it is not surprising that a very low energy input can cause significant changes in Fermi level position and resistance values. Further, the inventor speculates that a change to the hexagonal/rhombohedral phase from the face centered cubic phase can be explained by movement by as few as 2% of the germanium and/or antimony atoms from the crystallite in their attempt to assume a preferred compositional ratio ($Te_{52}Ge_{48}$ is preferred in the binary composition). Since the loss of each atom provides the crystallite with an extra hole, there would be an increase in free charge concentration per cubic centimeter on the order of $10^{21}$, a value which would not be masked by thermal generation in this narrow band gap material. It is this type of increase in free charge concentration which will be referred to herein as "self-doping" or "self-compensation". It is additionally noteworthy that the band gap of these semiconductor compositions can be widened or further narrowed by alloying with other semiconductor materials such as silicon or sulphur or carbon. Further, reductions in set current could also be achieved by alloying the composition with other semiconductor materials such as selenium.

As indicated hereinabove, FIG. 5 is a ternary diagram of the Ge—Te—Sb semiconductor alloy system. In addition to the information on the ten phases previously discussed of which the binary and ternary phases are indicated by squares, (■) this diagram provides information on the segregation of other alloys. These other alloys are indicated by triangles (▲), diamonds (♦) and circles (●) and phases into which the alloys segregate, upon rapid solidification from the melt, are indicated by the lines (solid or dashed) which extend therefrom. The starting compositions of two Te—rich melts are indicated by circular symbols on the ternary diagram. Upon rapid solidification, these mixtures phase segregate into elemental Te plus phases B, C and D.

Melts with compositions to the right of the pseudobinary line, indicated by diamond symbols, solidify into the phases indicated by the lines on the diagram. Other mixtures, indicated by triangles in the phase diagram, solidify into elemental Ge and Sb and into phase A. An alloy of particular interest for use in the improved memory elements of the present invention is $Ge_{22}Sb_{22}Te_{56}$, also referred to as $Ge_2Sb_2Te_5$ or 2-2-5. This 2-2-5 alloy, upon rapid solidification, phase segregates into a mixture of two distinct phases of compositions B ($Ge_{26}Sb_{18}Te_{56}$) and C ($Ge_{18}Sb_{26}Te_{56}$) indicated in the phase diagram of FIG. 5. Another alloy of particular interest is $Ge_{14}Sb_{29}Te_{57}$ (also referred to as $GeSb_2Te_4$ or 1-2-4) which is composition D on the GeTe—$Sb_2Te_3$ pseudobinary line. The 2-2-5 and 1-2-4 alloys are of interest for forming the volume of memory material in compositionally graded, layered or combine graded/layered form, as discussed hereinabove.

Figure 6:
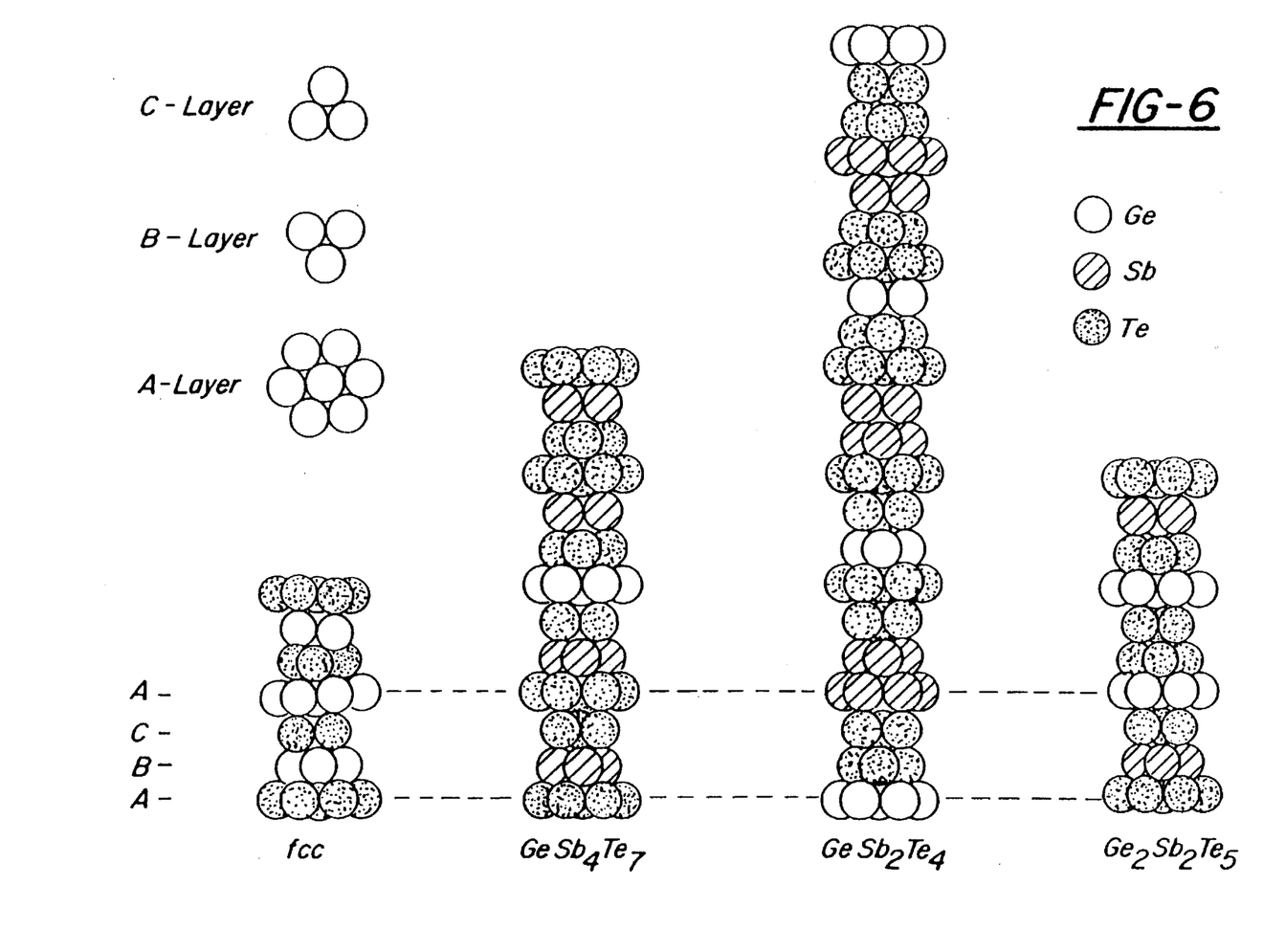
FIG. 6 depicts the atomic structural layering of three ternary alloys of the Ge—Sb—Te system of FIG. 5 as well as the atomic structure of binary Ge—Te so as to illustrate the anisotropic structure of the systems.

FIG. 6 depicts the atomic structure of three ternary alloys of the Ge—Sb—Te system as well as the atomic structure of the binary Ge—Te alloy. Two of the three ternary alloys are the 1-2-4 (composition D on the ternary diagram of FIG. 5) and the 2-2-5 compositions described hereinabove. The third ternary alloy is $Ge_8Sb_{33}Te_{59}$ which is also referred to as $GeSb_4Te_7$ or 1-4-7. This 1-4-7 alloy corresponds to composition E on the ternary phase diagram of FIG. 6. In the depictions of the atomic structures of these alloys, the hollow circles represent Ge atoms, the striated circles represent Sb atoms and the stippled circles depict Te atoms. As shown by FIG. 6, the atomic configuration of each of the alloys, when in the face centered cubic crystalline structure, is formed of ordered, repeated layers of atoms. The fcc configuration form three distinct types of layers which are labeled A, B and C in FIG. 6. Layers of type B and C are three atom layers, while layers of type A are 7 atom layers.

The 1-4-7, 1-2-4, and 2-2-5 alloys depicted in FIG. 6 are of interest as base materials for use in the elementally modified memory materials of the instant invention. The transition metals, along with Se, when present, are incorporated relatively uniformly throughout the Te—Ge—Sb matrix and enhance the electronic/atomic structure so as to produce reduced switching current requirements and increased thermal stability of data retention. Current analysis shows that the Se replaces Te in the structure, and while the exact positioning of the transition metal is not known, it appears that the transition metal bonds with the chalcogen element.

Also, as mentioned hereinabove, when the Ge—Sb—Te alloy materials are deposited by evaporation onto a heated substrate, the materials are deposited in anisotropic form. That is, when deposited in this fashion, the crystallites of the alloy materials are oriented such that the layers of constituent atomic elements are aligned substantially parallel to the substrate surface. This will, of course, result in anisotropic current flow, but makes possible the arrangement of the atoms of the material so as to employ set and reset pulses in the low resistance direction and thereby achieve still lower set and reset currents, voltages and/or energies.

Figure 7:
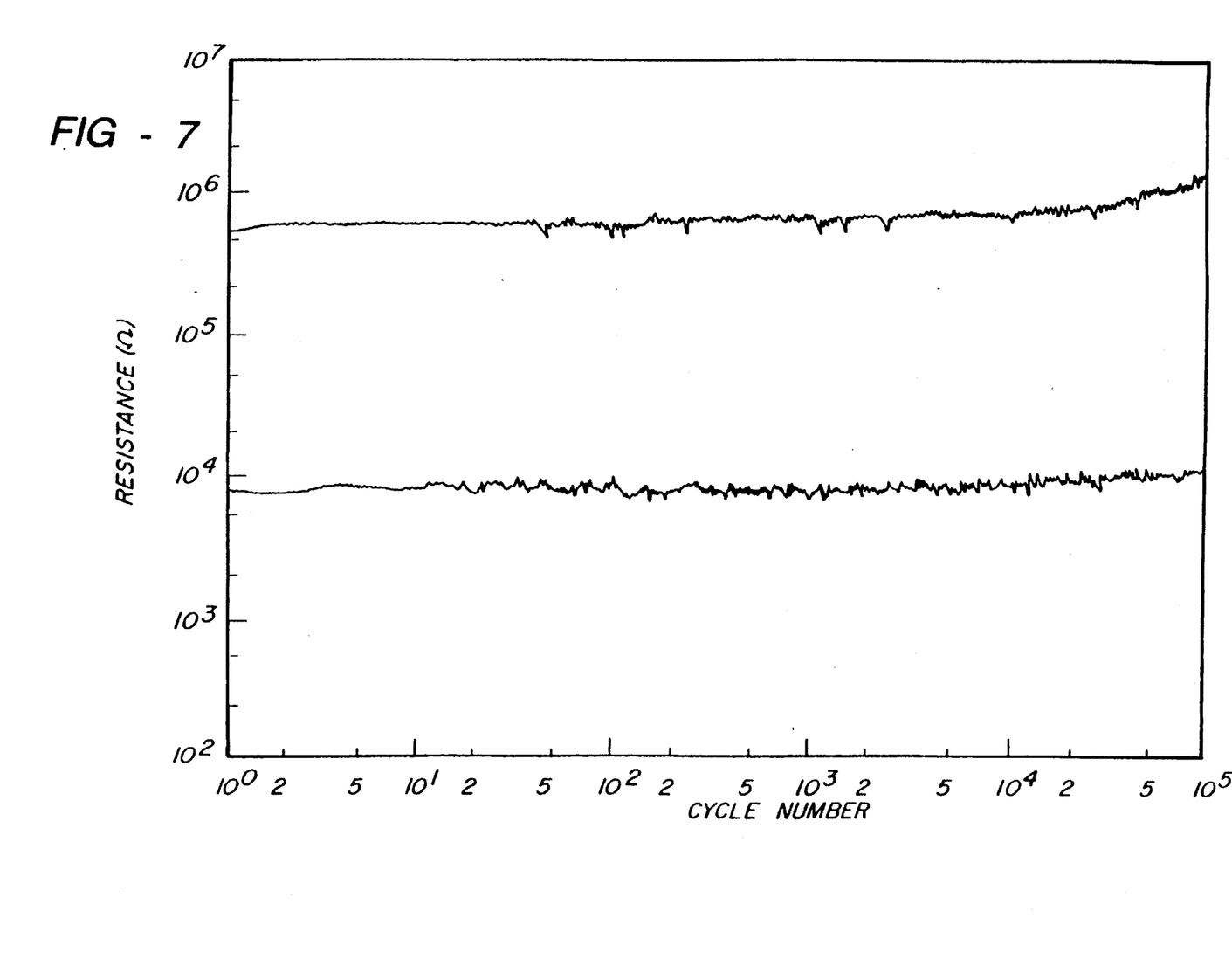
FIG. 7 is a graphical representation of cycle life data taken for a volume of memory material having a nominal chemical composition of $(Te_{56}Ge_{22}Sb_{22})_{90}Ni_5Se_5$ and specifically depicting device resistance plotted on the ordinate versus write/erase cycle number plotted on the abscissa.

FIG. 7 is a graphical representation of data taken for a memory element having the nominal chemical composition of $(Te_{56}Ge_{22}Sb_{22})_{90}Ni_5Se_5$ and specifically depicting device resistance plotted on the ordinate versus write/erase cycle number plotted on the abscissa. The element was switched using pulses of 40 nanoseconds duration at 3.1 Volts and 2 milliamperes current to set the element at the high resistance value and pulses of 400 nanoseconds duration at 1.9 Volts and 1 milliampere current to set the element to the low resistance value. This graph shows highly stable switching between two detectable values of resistance using switching pulses of relatively low current and a life of greater than $10^5$ write/erase cycles.

On average, the memory elements of the instant invention can be set to a low resistance value by a selected pulse duration of between about 100 and about 500 nanoseconds using a pulse voltage of between about 1 and about 2 Volts and a pulse current of between about 0.5 and about 1 milliamperes and can be set to a high resistance value by a selected pulse duration of between about 30 and about 50 nanoseconds using a pulse voltage of between about 2 and about 3 Volts and a pulse current of between about 0.75 and about 5 milliamperes. These switching currents are significantly lower than those of prior art memory elements and offer substantial power savings when compared to the power consumption of present mechanical hard drive memory storage.

Figure 8:
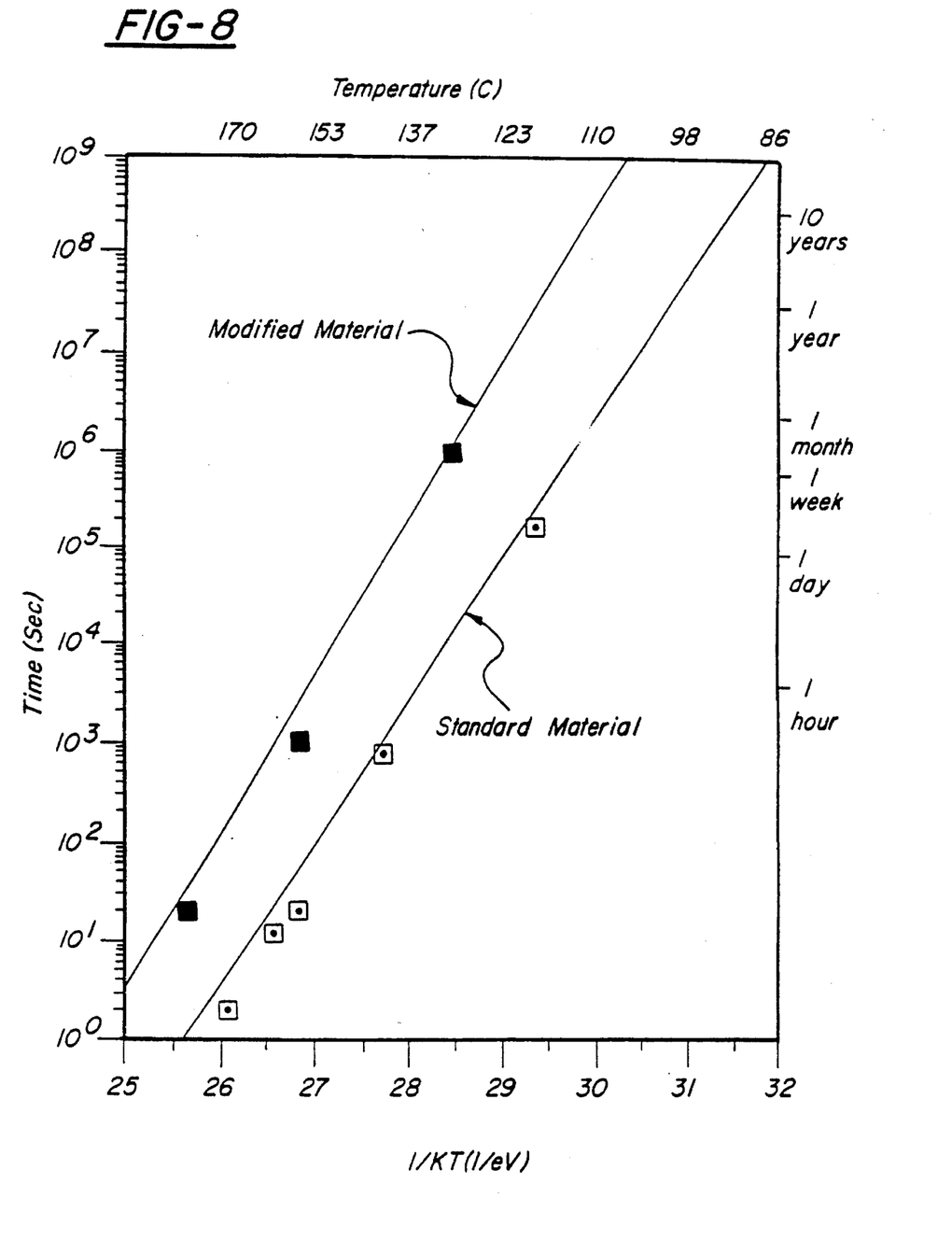
FIG. 8 is a graphical representation of data taken for the memory material of the instant invention having a nominal chemical composition of $(Te_{56}Ge_{22}Sb_{22})_{90}Ni_5Se_5$ (i.e. the modified material) and a memory element including a volume of memory material having a nominal chemical composition of $Te_{56}Ge_{22}Sb_{22}$ (i.e. the standard material), specifically depicting data retention time plotted on the ordinates versus device temperature (or a function thereof) on the abscissas.

FIG. 8 is a graphical representation of data taken for a memory element having a nominal chemical composition of $(Te_{56}Ge_{22}Sb_{22})_{90}Ni_5Se_5$ (i.e. the modified material) and a memory element having a nominal chemical composition of $Te_{56}Ge_{22}Sb_{22}$ (i.e. the standard material), specifically depicting data retention time plotted on the ordinate versus device temperature (or a function thereof) on the abscissa. The data retention test consists of heating the device to a desired test temperature and then applying an electrical pulse thereto to switch the device to a high resistance state. Immediately thereafter the resistance of the device is read numerous times to evaluate the effect of the increased temperature thereon. Typically, the resistance rises for a short time and then begins to fall. The criterion employed to determine loss of data is the point in time at which the device resistance falls to a value below that which was measured immediately after the electrical pulse was applied.

A perusal of FIG. 8 shows that devices incorporating the standard memory material will retain their data for about 10 years at a steady-state temperature of about 90 degree(s) C., while the memory devices of the instant invention which incorporate the modified memory material will retain their data for about 10 years at a temperature of about 110 degree(s) C. This represents a significant increase over the standard memory material and makes the memory elements incorporating the modified memory material much more reliable in high temperature uses.

Through the use of the proprietary materials and device configurations disclosed herein, an electrically erasable, directly overwritable memory element has been developed which provides fast read and write speeds, approaching those of SRAM devices; non-volatility and random access reprogramming capabilities of an EEPROM; and a price per megabyte of storage that approaches that of hard disk memory. The free charge concentration modulation capabilities of the materials of the present invention will have significant economic impact in the field of semiconductor devices. As detailed in the background section above, the charge carrier modulation disclosed herein represents a fifth type of charge carrier modulation, one that represents a fundamental departure from the prior art. Simply stated, in the materials of the present invention, even after removal of the field, the Fermi level position, the electrical conductivity, and the concentration of free charge remain fixed. Thus, it becomes possible to build a new class of semiconductor devices in which three terminals or two terminals can be employed and the device is preprogrammed to preselected values of electrical resistivity. The programming voltages and/or currents are remarkably low and the reaction speeds are remarkably fast. This is because the semiconductor materials of the present invention have inherent speed and energy capabilities resulting from modulation that occurs within one or more different crystalline phases.

There is a threshold switching event associated with the programming of the Ovonic EEPROM and, therefore, the Ovonic EEPROM programming voltage shows a chalcogenide alloy film thickness dependence. In fact, in the Ovonic EEPROM, a threshold switching voltage serves to separate read events from programming events, eliminating read upset and providing good operational margin during data reading. Our devices show linear resistance characteristics when the applied field is low, followed by a gradual decrease in resistance with increasing field, up to a threshold voltage. Once the threshold voltage is exceeded, the device exhibits a negative resistance transition to a highly conductive, "dynamic on" state. When the applied field is removed, the device returns to a non-volatile programmed resistance state, the value of which depends on the current/energy profile the device has experienced during its "memory equilibration time" while in the dynamic on state. Although the threshold voltage depends on the resistance of the device, the device current at the threshold voltage is relatively constant for all device resistances. A linear approximation to the thickness, threshold voltage relationship shows a proportionality factor of less than one, which contributes to a wide operating margin in devices having the same nominal thickness.

As the device thickness is reduced, the absolute resistance of the device will decrease by the same fraction. At some thicknesses, however, contact resistances can be expected to dominate over the smaller resistance values of the memory material. With the amorphous carbon electrodes we are currently using, this contact resistance effect will be less significant than the lower conductivity silicide electrode materials, such as palladium silicide or tungsten silicide, which are more conventionally used in wafer fabrication facilities. As mentioned hereinabove, carbon was originally selected because of its ability to prevent interdiffusion; however with the use of a contact such as tungsten silicide, diffusion of tungsten into the chalcogenide would provide additional p-orbitals and thereby enhance the electronic switching set forth herein.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. In an electrically operated, directly overwritable, multi-bit, single-cell memory element, including a volume of memory material defining a single cell memory element, said memory material including at least one chalcogen element and at least one transition metal element, the improvement comprising:

said at least one transition metal selected from the group consisting of Nb, Pd, Pt and mixtures or alloys thereof.

2. The memory element of claim 1 wherein said at least one transition metal is Pd.

3. The memory element of claim 1 wherein said chalcogen element is selected from the group of Te, Se and mixtures thereof.

4. The memory element of claim 3 wherein said chalcogen element is a mixture of both Te and Se.

5. The memory element of claim 3 wherein said memory material includes Te, Ge, Sb and said at least one transition metal, in the ratio $(Te_aGe_bSb_{100-(a+b)})_cTM_{100-c}$ where the subscripts are in atomic percentages which total 100% of the constituent elements wherein TM is one or more transition metals selected from the group consisting of Nb, Pd, Pt and mixtures and alloys thereof; and $a \leq 70$, $5 \leq b \leq 50$, and $90 \leq c \leq 99.99$.

6. The memory element of claim 5 wherein $48 \leq a \leq 58$ and $8 \leq b \leq 40$.

7. The memory element of claim 5 wherein said at least one transition metal is Pd.

8. The memory element of claim 5 wherein said at least one transition metal is Nb.

9. The memory element of claim 5 wherein said at least one transition metal is Pt.

10. The memory element of claim 1 wherein one or more elements are compositionally graded throughout the volume of memory material so as to reduce set resistance drift.

11. The memory element of claim 1 wherein said memory material additionally includes one or more elements selected from the group consisting of Ge, Sb, Bi, Pb, Sn, As, S, Si, Bi, P, O and mixtures or alloys thereof.

12. The memory element of claim 4 wherein said memory material includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements wherein TM is one or more transition metals selected from the group consisting of Nb, Pd, Pt and mixtures and alloys thereof; and $a \leq 70$, $5 \leq b \leq 50$, $90 \leq c \leq 99.5$, and $0.01 \leq d \leq 10$.

13. The memory element of claim 12 wherein said at least one transition metal is Pd.

14. The memory element of claim 12 wherein said at least one transition metal is Nb.

15. The memory element of claim 12 wherein said at least one transition metal is Pt.

16. The memory element of claim 12 wherein $48 \leq a \leq 58$ and $8 \leq b \leq 40$.

17. The memory element of claim 1 wherein said memory material further includes at least one transition metal selected from the group consisting of Fe, Cr, Ni and mixtures or alloys thereof.

18. The memory element of claim 1 wherein said volume of memory material and said contacts are formed so as to define a matrix array of thin-film material.

19. The memory element of claim 18 wherein each memory element in said array is addressably isolated from other memory element in the array by thin-film isolation devices.

20. The memory element of claim 19 wherein the combination of thin-film memory elements and isolation devices define a three dimensional, multilevel array of discreetly addressable high density memory cells.

* * * * *